United States Patent
Sofer et al.

(10) Patent No.: US 7,466,594 B2
(45) Date of Patent: *Dec. 16, 2008

(54) DYNAMIC MATCHING OF SIGNAL PATH AND REFERENCE PATH FOR SENSING

(75) Inventors: Yair Sofer, Tel Aviv (IL); Eduardo Maayan, Kfar Saba (IL); Yoram Betser, Mazkeret Batya (IL)

(73) Assignee: Saifun Semiconductors Ltd., Netanya (IL)

( * ) Notice: Subject to any disclaimer, the term of this patent is extended or adjusted under 35 U.S.C. 154(b) by 47 days.

This patent is subject to a terminal disclaimer.

(21) Appl. No.: 11/490,539

(22) Filed: Jul. 19, 2006

(65) Prior Publication Data

US 2007/0171717 A1    Jul. 26, 2007

Related U.S. Application Data

(63) Continuation of application No. 10/916,413, filed on Aug. 12, 2004, now Pat. No. 7,095,655.

(51) Int. Cl.
*G11C 16/06* (2006.01)

(52) U.S. Cl. .............................. 365/185.21; 365/185.11; 365/185.13; 365/185.2

(58) Field of Classification Search ............. 365/185.21
See application file for complete search history.

(56) References Cited

U.S. PATENT DOCUMENTS 3,881,180 A    4/1975  Gosney, Jr.

(Continued)

FOREIGN PATENT DOCUMENTS

EP    0 656 628    6/1995

(Continued)

OTHER PUBLICATIONS

U.S. Appl. No. 08/902,890, filed Jul. 30, 1997, Eitan.

(Continued)

*Primary Examiner*—Son L Mai
(74) *Attorney, Agent, or Firm*—EMPK & Shiloh, LLP (57) ABSTRACT

A method for operating a non-volatile memory cell device, the method including providing an array of memory array cells connected to word lines and local bit lines, the local bit lines being connected to global bit lines via select transistors, the array being divided into isolated sectors, providing a sense amplifier operative to sense the memory array cells via a sensing path that includes at least one of the local bit lines, at least one of the select transistors, at least one accessed global bit line, and a YMUX, providing a reference cell located in a reference mini-array, the reference cell being connected to the YMUX and being connected to the sense amplifier via another sensing path, driving both the memory array cells and the reference cells with a common bit line (BL) driver connected to the memory array cells and the reference cells via the YMUX through accessed global bit lines, and matching the sensing path of the memory array cell and the sensing path of the reference cell to the sense amplifier by using a non-accessed global bit line in the sensing path between the reference cell and the sense amplifier. The non-accessed global bit line may be dynamically chosen as the global bit line adjacent to the global bit line used for driving both the drains of the array and the reference cells.

12 Claims, 5 Drawing Sheets

U.S. PATENT DOCUMENTS

| | | |
|---|---|---|
| 3,895,360 A | 7/1975 | Cricchi et al. |
| 3,952,325 A | 4/1976 | Beale et al. |
| 4,016,588 A | 4/1977 | Ohya et al. |
| 4,017,888 A | 4/1977 | Christie et al. |
| 4,145,703 A | 3/1979 | Blanchard et al. |
| 4,151,021 A | 4/1979 | McElroy |
| 4,173,766 A | 11/1979 | Hayes |
| 4,173,791 A | 11/1979 | Bell |
| 4,247,861 A | 1/1981 | Hsu et al. |
| 4,257,832 A | 3/1981 | Schwabe et al. |
| 4,281,397 A | 7/1981 | Neal et al. |
| 4,306,353 A | 12/1981 | Jacobs et al. |
| 4,342,102 A | 7/1982 | Puar |
| 4,342,149 A | 8/1982 | Jacobs et al. |
| 4,360,900 A | 11/1982 | Bate |
| 4,373,248 A | 2/1983 | McElroy |
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |

| | | | | | |
|---|---|---|---|---|---|
| 5,596,527 A | 1/1997 | Tomioka et al. | 5,867,429 A | 2/1999 | Chen et al. |
| 5,599,727 A | 2/1997 | Hakozaki et al. | 5,870,334 A | 2/1999 | Hemink et al. |
| 5,600,586 A | 2/1997 | Lee et al. | 5,870,335 A | 2/1999 | Khan et al. |
| 5,604,804 A | 2/1997 | Micali | 5,872,848 A | 2/1999 | Romney et al. |
| 5,606,523 A | 2/1997 | Mirabel | 5,875,128 A | 2/1999 | Ishizuka et al. |
| 5,608,679 A | 3/1997 | Mi et al. | 5,877,537 A | 3/1999 | Aoki |
| 5,612,642 A | 3/1997 | McClinyock | 5,880,620 A | 3/1999 | Gitlin et al. |
| 5,617,357 A | 4/1997 | Haddad et al. | 5,886,927 A | 3/1999 | Takeuchi |
| 5,623,438 A | 4/1997 | Guritz et al. | RE36,179 E | 4/1999 | Shimoda |
| 5,627,790 A | 5/1997 | Golla et al. | 5,892,710 A | 4/1999 | Fazio et al. |
| 5,633,603 A | 5/1997 | Lee | 5,903,031 A | 5/1999 | Yamada et al. |
| 5,636,288 A | 6/1997 | Bonneville et al. | 5,910,924 A | 6/1999 | Tanaka et al. |
| 5,644,531 A | 7/1997 | Kuo et al. | 5,920,503 A | 7/1999 | Lee et al. |
| 5,650,959 A | 7/1997 | Hayashi et al. | 5,920,507 A | 7/1999 | Takeuchi et al. |
| 5,654,568 A | 8/1997 | Nakao | 5,926,409 A | 7/1999 | Engh et al. |
| 5,656,513 A | 8/1997 | Wang et al. | 5,930,195 A | 7/1999 | Komatsu et al. |
| 5,657,332 A | 8/1997 | Auclair et al. | 5,933,366 A | 8/1999 | Yoshikawa |
| 5,661,060 A | 8/1997 | Gill et al. | 5,933,367 A | 8/1999 | Matsuo et al. |
| 5,663,907 A | 9/1997 | Frayer et al. | 5,936,888 A | 8/1999 | Sugawara |
| 5,666,365 A | 9/1997 | Kostreski | 5,940,332 A | 8/1999 | Artieri |
| 5,672,959 A | 9/1997 | Der | 5,946,258 A | 8/1999 | Evertt et al. |
| 5,675,280 A | 10/1997 | Nomura | 5,946,558 A | 8/1999 | Hsu |
| 5,677,867 A | 10/1997 | Hazani | 5,949,714 A | 9/1999 | Hemink et al. |
| 5,677,869 A | 10/1997 | Fazio et al. | 5,949,728 A | 9/1999 | Liu et al. |
| 5,683,925 A | 11/1997 | Irani et al. | 5,959,311 A | 9/1999 | Shih et al. |
| 5,689,459 A | 11/1997 | Chang et al. | 5,963,412 A | 10/1999 | En |
| 5,694,356 A | 12/1997 | Wong et al. | 5,963,465 A | 10/1999 | Eitan |
| 5,696,929 A | 12/1997 | Hasbun et al. | 5,966,603 A | 10/1999 | Eitan |
| 5,708,608 A | 1/1998 | Park et al. | 5,969,989 A | 10/1999 | Iwahashi |
| 5,712,814 A | 1/1998 | Fratin et al. | 5,969,993 A | 10/1999 | Takeshima |
| 5,712,815 A | 1/1998 | Bill et al. | 5,973,373 A | 10/1999 | Krautschneider et al. |
| 5,715,193 A | 2/1998 | Norman | 5,982,666 A | 11/1999 | Campardo |
| 5,717,581 A | 2/1998 | Canclini | 5,986,940 A | 11/1999 | Atsumi et al. |
| 5,717,632 A | 2/1998 | Richart et al. | 5,990,526 A | 11/1999 | Bez et al. |
| 5,717,635 A | 2/1998 | Akatsu | 5,991,202 A | 11/1999 | Derhacobian et al. |
| 5,721,781 A | 2/1998 | Deo et al. | 5,999,444 A | 12/1999 | Fujiwara et al. |
| 5,726,946 A | 3/1998 | Yamagata et al. | 5,999,494 A | 12/1999 | Holzrichter |
| 5,748,534 A | 5/1998 | Dunlap et al. | 6,000,006 A | 12/1999 | Bruce et al. |
| 5,751,037 A | 5/1998 | Aozasa et al. | 6,005,423 A | 12/1999 | Schultz |
| 5,751,637 A | 5/1998 | Chen et al. | 6,011,725 A | 1/2000 | Eitan |
| 5,754,475 A | 5/1998 | Bill et al. | 6,018,186 A | 1/2000 | Hsu |
| 5,760,445 A | 6/1998 | Diaz | 6,020,241 A | 2/2000 | You et al. |
| 5,760,634 A | 6/1998 | Fu | 6,028,324 A | 2/2000 | Su et al. |
| 5,768,192 A | 6/1998 | Eitan | 6,030,871 A | 2/2000 | Eitan |
| 5,768,193 A | 6/1998 | Lee et al. | 6,034,403 A | 3/2000 | Wu |
| 5,771,197 A | 6/1998 | Kim | 6,034,896 A | 3/2000 | Ranaweera et al. |
| 5,774,395 A | 6/1998 | Richart et al. | 6,037,627 A | 3/2000 | Kitamura et al. |
| 5,777,919 A | 7/1998 | Chi-Yung et al. | 6,040,610 A | 3/2000 | Noguchi et al. |
| 5,781,476 A | 7/1998 | Seki et al. | 6,044,019 A | 3/2000 | Cernea et al. |
| 5,781,478 A | 7/1998 | Takeuchi et al. | 6,044,022 A | 3/2000 | Nachumovsky |
| 5,783,934 A | 7/1998 | Tran | 6,063,666 A | 5/2000 | Chang et al. |
| 5,784,314 A | 7/1998 | Sali et al. | 6,064,226 A | 5/2000 | Earl |
| 5,787,036 A | 7/1998 | Okazawa | 6,064,251 A | 5/2000 | Park |
| 5,793,079 A | 8/1998 | Georgescu et al. | 6,064,591 A | 5/2000 | Takeuchi et al. |
| 5,801,076 A | 9/1998 | Ghneim et al. | 6,074,916 A | 6/2000 | Cappelletti |
| 5,805,500 A | 9/1998 | Campardo et al. | 6,075,402 A | 6/2000 | Ghilardelli |
| 5,808,506 A | 9/1998 | Tran | 6,075,724 A | 6/2000 | Li et al. |
| 5,812,449 A | 9/1998 | Song | 6,078,518 A | 6/2000 | Chevallier |
| 5,812,456 A | 9/1998 | Hull et al. | 6,081,456 A | 6/2000 | Dadashev |
| 5,812,457 A | 9/1998 | Arase | 6,084,794 A | 7/2000 | Lu et al. |
| 5,815,435 A | 9/1998 | Van Tran | 6,091,640 A | 7/2000 | Kawahara et al. |
| 5,822,256 A | 10/1998 | Bauer et al. | 6,094,095 A | 7/2000 | Murray et al. |
| 5,825,683 A | 10/1998 | Chang et al. | 6,097,639 A | 8/2000 | Choi et al. |
| 5,825,686 A | 10/1998 | Schmitt-Landsiedel et al. | 6,107,862 A | 8/2000 | Mukainakano et al. |
| 5,828,601 A | 10/1998 | Hollmer et al. | 6,108,240 A | 8/2000 | Lavi et al. |
| 5,834,851 A | 11/1998 | Ikeda et al. | 6,108,241 A | 8/2000 | Chevallier |
| 5,835,935 A | 11/1998 | Estakhri et al. | 6,117,714 A | 9/2000 | Beatty |
| 5,836,772 A | 11/1998 | Chang et al. | 6,118,207 A | 9/2000 | Ormerod et al. |
| 5,841,700 A | 11/1998 | Chang | 6,118,692 A | 9/2000 | Banks |
| 5,847,441 A | 12/1998 | Cutter et al. | 6,122,198 A | 9/2000 | Haddad et al. |
| 5,861,771 A | 1/1999 | Matsuda et al. | 6,128,226 A | 10/2000 | Eitan et al. |
| 5,862,076 A | 1/1999 | Eitan | 6,128,227 A | 10/2000 | Kim |
| 5,864,164 A | 1/1999 | Wen | 6,130,452 A | 10/2000 | Lu et al. |

| | | | | | |
|---|---|---|---|---|---|
| 6,130,572 A | 10/2000 | Ghilardelli et al. | 6,335,990 B1 | 1/2002 | Chen et al. |
| 6,130,574 A | 10/2000 | Bloch et al. | 6,337,502 B1 | 1/2002 | Eitan et al. |
| 6,133,095 A | 10/2000 | Eitan et al. | 6,339,556 B1 | 1/2002 | Watanabe |
| 6,134,156 A | 10/2000 | Eitan | 6,343,033 B1 | 1/2002 | Parker |
| 6,137,718 A | 10/2000 | Reisinger | 6,344,959 B1 | 2/2002 | Milazzo |
| 6,147,904 A | 11/2000 | Liron | 6,346,442 B1 | 2/2002 | Aloni et al. |
| 6,147,906 A | 11/2000 | Bill et al. | 6,348,381 B1 | 2/2002 | Jong |
| 6,150,800 A | 11/2000 | Kinoshita et al. | 6,348,711 B1 | 2/2002 | Eitan |
| 6,154,081 A | 11/2000 | Pakkala et al. | 6,351,415 B1 | 2/2002 | Kushnarenko |
| 6,156,149 A | 12/2000 | Cheung et al. | 6,353,356 B1 | 3/2002 | Liu |
| 6,157,242 A | 12/2000 | Fukui | 6,353,554 B1 | 3/2002 | Banks |
| 6,157,570 A | 12/2000 | Nachumovsky | 6,353,555 B1 | 3/2002 | Jeong |
| 6,163,048 A | 12/2000 | Hirose et al. | 6,356,062 B1 | 3/2002 | Elmhurst et al. |
| 6,163,484 A | 12/2000 | Uekubo | 6,356,469 B1 | 3/2002 | Roohparvar et al. |
| 6,169,691 B1 | 1/2001 | Pasotti et al. | 6,359,501 B2 | 3/2002 | Lin et al. |
| 6,175,519 B1 | 1/2001 | Lu et al. | 6,374,337 B1 | 4/2002 | Estakhri |
| 6,175,523 B1 | 1/2001 | Yang et al. | 6,385,086 B1 | 5/2002 | Mihara et al. |
| 6,181,597 B1 | 1/2001 | Nachumovsky | 6,396,741 B1 | 5/2002 | Bloom et al. |
| 6,181,605 B1 | 1/2001 | Hollmer et al. | 6,400,209 B1 | 6/2002 | Matsuyama et al. |
| 6,185,143 B1 | 2/2001 | Perner et al. | 6,400,607 B1 | 6/2002 | Pasotti et al. |
| 6,188,211 B1 | 2/2001 | Rincon-Mora et al. | 6,407,537 B2 | 6/2002 | Antheunis |
| 6,190,966 B1 | 2/2001 | Ngo et al. | 6,410,388 B1 | 6/2002 | Kluth et al. |
| 6,192,445 B1 | 2/2001 | Rezvani | 6,417,081 B1 | 7/2002 | Thurgate |
| 6,195,196 B1 | 2/2001 | Kimura et al. | 6,418,506 B1 | 7/2002 | Pashley et al. |
| 6,198,342 B1 | 3/2001 | Kawai | 6,426,898 B1 | 7/2002 | Mihnea et al. |
| 6,201,282 B1 | 3/2001 | Eitan | 6,429,063 B1 | 8/2002 | Eitan |
| 6,201,737 B1 | 3/2001 | Hollmer et al. | 6,433,624 B1 | 8/2002 | Grossnickle et al. |
| 6,205,055 B1 | 3/2001 | Parker | 6,436,766 B1 | 8/2002 | Rangarajan et al. |
| 6,205,056 B1 | 3/2001 | Pan et al. | 6,436,768 B1 | 8/2002 | Yang et al. |
| 6,205,059 B1 | 3/2001 | Gutala et al. | 6,438,031 B1 | 8/2002 | Fastow |
| 6,208,200 B1 | 3/2001 | Arakawa | 6,438,035 B2 | 8/2002 | Yamamoto et al. |
| 6,208,557 B1 | 3/2001 | Bergemont et al. | 6,440,797 B1 | 8/2002 | Wu et al. |
| 6,214,666 B1 | 4/2001 | Mehta | 6,442,074 B1 | 8/2002 | Hamilton et al. |
| 6,215,148 B1 | 4/2001 | Eitan | 6,445,030 B1 | 9/2002 | Wu et al. |
| 6,215,697 B1 | 4/2001 | Lu et al. | 6,448,750 B1 | 9/2002 | Shor et al. |
| 6,215,702 B1 | 4/2001 | Derhacobian et al. | 6,449,188 B1 | 9/2002 | Fastow |
| 6,218,695 B1 | 4/2001 | Nachumovsky | 6,449,190 B1 | 9/2002 | Bill |
| 6,219,277 B1 | 4/2001 | Devin et al. | 6,452,438 B1 | 9/2002 | Li |
| 6,219,290 B1 | 4/2001 | Chang et al. | 6,455,896 B1 | 9/2002 | Chou et al. |
| 6,222,762 B1 | 4/2001 | Guterman et al. | 6,456,528 B1 | 9/2002 | Chen |
| 6,222,768 B1 | 4/2001 | Hollmer et al. | 6,456,533 B1 | 9/2002 | Hamilton et al. |
| 6,233,180 B1 | 5/2001 | Eitan et al. | 6,458,656 B1 | 10/2002 | Park et al. |
| 6,240,032 B1 | 5/2001 | Fukumoto | 6,458,677 B1 | 10/2002 | Hopper et al. |
| 6,240,040 B1 | 5/2001 | Akaogi et al. | 6,469,929 B1 | 10/2002 | Kushnarenko et al. |
| 6,246,555 B1 | 6/2001 | Tham | 6,469,935 B2 | 10/2002 | Hayashi |
| 6,252,442 B1 | 6/2001 | Malherbe | 6,472,706 B2 | 10/2002 | Widdershoven et al. |
| 6,252,799 B1 | 6/2001 | Liu et al. | 6,477,084 B1 | 11/2002 | Eitan |
| 6,256,231 B1 | 7/2001 | Lavi et al. | 6,477,085 B1 | 11/2002 | Kuo |
| 6,261,904 B1 | 7/2001 | Pham et al. | 6,490,204 B2 | 12/2002 | Bloom et al. |
| 6,265,268 B1 | 7/2001 | Halliyal et al. | 6,496,414 B2 | 12/2002 | Kasa et al. |
| 6,266,281 B1 | 7/2001 | Derhacobian et al. | 6,504,756 B2 | 1/2003 | Gonzalez et al. |
| 6,272,047 B1 | 8/2001 | Mihnea et al. | 6,510,082 B1 | 1/2003 | Le et al. |
| 6,275,414 B1 | 8/2001 | Randolph et al. | 6,512,701 B1 | 1/2003 | Hamilton et al. |
| 6,281,545 B1 | 8/2001 | Liang et al. | 6,519,180 B2 | 2/2003 | Tran et al. |
| 6,282,133 B1 | 8/2001 | Nakagawa et al. | 6,519,182 B1 | 2/2003 | Derhacobian et al. |
| 6,282,145 B1 | 8/2001 | Tran et al. | 6,522,585 B2 | 2/2003 | Pasternak |
| 6,285,246 B1 | 9/2001 | Basu | 6,525,969 B1 | 2/2003 | Kurihara et al. |
| 6,285,574 B1 | 9/2001 | Eitan | 6,528,390 B2 | 3/2003 | Komori et al. |
| 6,285,589 B1 | 9/2001 | Kajitani | 6,529,412 B1 | 3/2003 | Chen et al. |
| 6,285,614 B1 | 9/2001 | Mulatti et al. | 6,532,173 B2 | 3/2003 | Lioka et al. |
| 6,292,394 B1 | 9/2001 | Cohen et al. | 6,535,020 B1 | 3/2003 | Yin |
| 6,297,096 B1 | 10/2001 | Boaz | 6,535,434 B2 | 3/2003 | Maayan et al. |
| 6,297,143 B1 | 10/2001 | Foote et al. | 6,537,881 B1 | 3/2003 | Rangarjan et al. |
| 6,297,974 B1 | 10/2001 | Ganesan et al. | 6,538,270 B1 | 3/2003 | Randolph et al. |
| 6,304,485 B1 | 10/2001 | Harari et al. | 6,541,816 B2 | 4/2003 | Ramsbey et al. |
| 6,307,784 B1 | 10/2001 | Hamilton et al. | 6,552,387 B1 | 4/2003 | Eitan |
| 6,307,807 B1 | 10/2001 | Sakui et al. | 6,555,436 B2 | 4/2003 | Ramsbey et al. |
| 6,320,786 B1 | 11/2001 | Chang et al. | 6,559,500 B2 | 5/2003 | Torii |
| 6,324,094 B1 | 11/2001 | Chevallier | 6,562,683 B1 | 5/2003 | Wang et al. |
| 6,326,265 B1 | 12/2001 | Liu et al. | 6,566,194 B1 | 5/2003 | Ramsbey et al. |
| 6,330,192 B1 | 12/2001 | Ohba et al. | 6,566,699 B2 | 5/2003 | Eitan |
| 6,331,950 B1 | 12/2001 | Kuo et al. | 6,567,303 B1 | 5/2003 | Hamilton et al. |
| 6,335,874 B1 | 1/2002 | Eitan | 6,567,312 B1 | 5/2003 | Torii et al. |

| | | |
|---|---|---|
| 6,570,211 B1 | 5/2003 | He et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |
| 6,583,007 B1 | 6/2003 | Eitan |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,608,905 B1 | 8/2003 | Muza et al. |
| 6,614,052 B1 | 9/2003 | Zhang |
| 6,614,295 B2 | 9/2003 | Tsuchi |
| 6,614,686 B1 | 9/2003 | Kawamura |
| 6,614,692 B2 | 9/2003 | Maayan et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |
| 6,653,191 B1 | 11/2003 | Yang et al. |
| 6,654,296 B2 | 11/2003 | Jang et al. |
| 6,664,588 B2 | 12/2003 | Eitan |
| 6,665,769 B2 | 12/2003 | Cohen et al. |
| 6,670,241 B1 | 12/2003 | Kamal et al. |
| 6,670,669 B1 | 12/2003 | Kawamura |
| 6,674,138 B1 | 1/2004 | Halliyal et al. |
| 6,677,805 B2 | 1/2004 | Shor et al. |
| 6,680,509 B1 | 1/2004 | Wu et al. |
| 6,686,242 B2 | 2/2004 | Willer et al. |
| 6,690,602 B1 | 2/2004 | Le et al. |
| 6,693,483 B2 | 2/2004 | Deml et al. |
| 6,700,818 B2 | 3/2004 | Shappir et al. |
| 6,717,207 B2 | 4/2004 | Kato |
| 6,723,518 B2 | 4/2004 | Papsidero et al. |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,781,876 B2 | 8/2004 | Forbes et al. |
| 6,788,579 B2 | 9/2004 | Gregori et al. |
| 6,791,396 B2 | 9/2004 | Shor et al. |
| 6,794,249 B2 | 9/2004 | Palm et al. |
| 6,794,280 B2 | 9/2004 | Chang |
| 6,818,956 B2 | 11/2004 | Kuo et al. |
| 6,829,172 B2 | 12/2004 | Bloom et al. |
| 6,831,872 B2 | 12/2004 | Matsuoka |
| 6,836,431 B2 | 12/2004 | Chang |
| 6,859,028 B2 | 2/2005 | Toner |
| 6,870,772 B1 | 3/2005 | Nitta et al. |
| 6,871,258 B2 | 3/2005 | Micheloni et al. |
| 6,885,585 B2 | 4/2005 | Maayan et al. |
| 6,885,590 B1 | 4/2005 | Zheng et al. |
| 6,906,357 B1 | 6/2005 | Vashchenko et al. |
| 6,912,160 B2 | 6/2005 | Yamada |
| 6,917,544 B2 | 7/2005 | Maayan et al. |
| 6,928,001 B2 | 8/2005 | Avni et al. |
| 6,930,928 B2 | 8/2005 | Liu et al. |
| 6,937,523 B2 | 8/2005 | Eshel |
| 6,954,393 B2 | 10/2005 | Lusky et al. |
| 6,967,872 B2 | 11/2005 | Quader et al. |
| 6,967,896 B2 | 11/2005 | Eisen et al. |
| 6,996,692 B2 | 2/2006 | Kouno |
| 7,043,672 B2 | 5/2006 | Merritt |
| 7,079,420 B2 | 7/2006 | Shappir et al. |
| 7,116,577 B2 | 10/2006 | Eitan |
| 7,123,510 B2 * | 10/2006 | Kojima et al. .......... 365/185.03 |
| 2001/0006477 A1 | 7/2001 | Banks |
| 2002/0004878 A1 | 1/2002 | Norman |
| 2002/0004921 A1 | 1/2002 | Muranaka et al. |
| 2002/0064911 A1 | 5/2002 | Eitan |
| 2002/0132436 A1 | 9/2002 | Eliyahu et al. |
| 2002/0140109 A1 | 10/2002 | Keshavarzi et al. |
| 2002/0145465 A1 | 10/2002 | Shor et al. |
| 2002/0191465 A1 | 12/2002 | Maayan et al. |
| 2002/0199065 A1 | 12/2002 | Subramoney et al. |
| 2003/0001213 A1 | 1/2003 | Lai |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0117841 A1 | 6/2003 | Yamashita |
| 2003/0131186 A1 | 7/2003 | Buhr |
| 2003/0134476 A1 | 7/2003 | Rolzin et al. |
| 2003/0142544 A1 | 7/2003 | Maayan et al. |
| 2003/0145176 A1 | 7/2003 | Dvir et al. |
| 2003/0145188 A1 | 7/2003 | Cohen et al. |
| 2003/0155659 A1 | 8/2003 | Verma et al. |
| 2003/0190786 A1 | 10/2003 | Ramsbey et al. |
| 2003/0197221 A1 | 10/2003 | Shinozaki et al. |
| 2003/0202411 A1 | 10/2003 | Yamada |
| 2003/0206435 A1 | 11/2003 | Takahashi |
| 2003/0208663 A1 | 11/2003 | Van Buskirk et al. |
| 2003/0209767 A1 | 11/2003 | Takahashi et al. |
| 2003/0214844 A1 | 11/2003 | Iijima |
| 2003/0218207 A1 | 11/2003 | Hashimoto et al. |
| 2003/0218913 A1 | 11/2003 | Le et al. |
| 2003/0222303 A1 | 12/2003 | Fukuda et al. |
| 2003/0227796 A1 | 12/2003 | Miki et al. |
| 2004/0007730 A1 | 1/2004 | Chou et al. |
| 2004/0012993 A1 | 1/2004 | Kurihara |
| 2004/0013000 A1 | 1/2004 | Torii |
| 2004/0014280 A1 | 1/2004 | Willer et al. |
| 2004/0014290 A1 | 1/2004 | Yang et al. |
| 2004/0021172 A1 | 2/2004 | Zheng et al. |
| 2004/0027858 A1 | 2/2004 | Takahashi et al. |
| 2004/0151034 A1 | 8/2004 | Shor et al. |
| 2004/0153821 A1 | 8/2004 | Polansky et al. |
| 2004/0157393 A1 | 8/2004 | Hwang |
| 2004/0222437 A1 | 11/2004 | Avni et al. |
| 2005/0117395 A1 | 6/2005 | Maayan et al. |
| 2005/0117601 A1 | 6/2005 | Anderson et al. |
| 2005/0140405 A1 | 6/2005 | Do et al. |
| 2005/0213593 A1 | 9/2005 | Anderson et al. |
| 2005/0232024 A1 | 10/2005 | Atir et al. |
| 2006/0084219 A1 | 4/2006 | Lusky et al. |
| 2006/0126382 A1 | 6/2006 | Maayan et al. |
| 2006/0126983 A1 | 6/2006 | Shappir et al. |

FOREIGN PATENT DOCUMENTS

| | | |
|---|---|---|
| EP | 0751560 | 6/1995 |
| EP | 0693781 | 1/1996 |

| | | |
|---|---|---|
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291982 | 10/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

U.S. Appl. No. 11/489,327, filed Jul. 18, 2006, Eitan et al.
U.S. Appl. No. 11/440,624, filed May 24, 2006, Lusky et al.
Bude et al., EEPROM/Flash Sub 3 0V drain—Source Bias Hot Carrier Writing, IEDM, 1995, pp. 989-992.
Bude et al., Secondary Electron Flash—a High Performance, Low Power Flash Technology for 0.35 um and below, IEDM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583, vol. 31, No. 11.
Campardo et al., IEEE Journal of Solid-State Circuits, Nov. 2000, 1655-1667, vol. 35, No. 11.
Lin et al., Novel Source-Controlled Self-Verified Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987, vol. EDL-8, No. 3.
Eitan et al., "Hot-Electron Injection into the Oxide in n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethelehem, Pennsylvania, p. 1-35, 1989.
Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.
Ma et al., A Dual-bit Split-Gate EEPROM (DSG) Cell in Contactless Array for Single-Vcc High Density Flash Memories, IEEE, 1994, 57-60.
Oshima et al., Process and Device Technologies for 16Mbit EPROMs with Large-Tilt-Angle Implanted P-Pocket Cell, IEEE, Dec. 1990, Ch. 2865-4/90/0000-0095, pp. 5 2 1-5 2 4, San Francisco, California.
Lee, A new approach for the floating-gate MOS nonvolatile memory, Applied Physics Letters, Oct. 1977, 475-476, vol. 31, No. 7, American Institute of Physics.
Glasser et al, MOS Device Electronics, The Design and Analysis of VLSI Circuits, Chapter 2, 67-163, 1998, Addison-Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.
Ricco et al., Nonvolatile Multilevel Memories for Digital Applications, Dec. 1998, 2399-2421, vol. 86, No. 12, Institute of Electrical and Electronics Engineers, Inc.
Martin, Improved Circuits for the Realization of Switched-Capacitor Filters, IEEE Transactions on Circuits and Systems, Apr. 1980, 237-244, vol. CAS-27.
Tseng et al., "Thin CVD Stacked Gate Dielectric for ULSI Technology", IEEE, pp. 321-214; 1993, 13.1.1-13.1.4.
Pickar, Ion Implementation is Silicon—Physics, Processing, and Microelectronic Devices, Applied Solid State Science, 1975, 151-241, vol. 5, Academic Press.
2 Bit/Cell EEPROM Cell Using Band-To-Band Tunneling for Data Read-Out, IBM Technical Disclosure Bulletin, 1992, 136-140, vol. 35, No. 4B.
Umezawa, et al., A 5-V-Only Operation 0.6-µm Flash EEPROM with Row Decoder Scheme in Triple-Well Structure, IEEE Journal of Solid-State Circuits, 1992, 1540, vol. 27.
Mitchell, et al , A new self-aligned planar array cell for ultra high density EPROMS, 1987.
Esquivet, et al., High Density Contactless, Self Aligned EPROM Cell Array Technology, 1986.
Johns, Martin, Analog Integrated Circuit Design, Jun. 1, 1997, Chapter 10, John Wiley and Sons Inc.
Allen, et al., CMOS Analog Circuit Design, 2002, 259pages, Oxford University Press.
Klinke, et al., A very-high-stew-rate CMOS operational amplifier, IEEE Journal of Solid-State Circuits, 1989, 744-746, 24 vol.
Shor, et al, paper WA2.04.01—Self regulated Four phased charge pump with boosted wells, ISCAS 2002.
Fotouhi, An efficient CMOS line driver for 1.544-Mb/s T1 and 2.048-Mb/s E1 applications, IEEE Journal of Solid-State Circuits, 2003, 228-236pages, 38vol.

P-N Junction Diode, Physics of semiconductor devices, 1981, ch. 2, "A Wiley-Interscience Publication", John Wiley & Sons Publishers.

Chang, Non Volatile Semiconductor Memory Devices, Proceedings of the IEEE, 64 vol., No. 7, pp. 1039-1059; Jul. 1976.

Yoon, Sukyoon, et al., A Novel Substrate Hot Electron and Hole Injection Structure with a double-Implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M Specht et al, Novel Dual Bit Tri- Gate Charge Trapping Memory Devices, IEEE Electron Device Letters, vol. 25, No. 12, Dec. 2004, pp. 810-812.

"Design Considerations in Scaled SONOS Nonvolatile Memory Devices" Bu, Jianking et al., Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

"SONOS Nonvolatile Semiconductor Memories for Space and Military Applications", Adams et al., Symposium, 2000. http://klabs.org/richcontent/MemoryContent/nvmt_symp/nvmts_2000/papers/adams_d.pdf.

"Phillips Research—Technologies—Embedded Nonvolatile Memories" http://research.phillips.com/technologies/ics/nv/memories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd. 1110 pgs.

"Phillips Research—Technologies—Embedded Nonvolatile Memories" http://research.phillips.com/technologies/ics/nvmemories/index.html, 2006.

"Semiconductor Memory: Non-Volatile Memory (NVM)", National University of Singapore, Department of Electrical and Computer Engineering: http://ece.nus.edu.sg/stfpage/elezhucx/myweb/NVM.pdf, 2000.

* cited by examiner

DYNAMIC MATCHING OF SIGNAL PATH AND REFERENCE PATH FOR SENSING

RELATED APPLICATIONS

This application is a continuation of U.S. patent application Ser. No. 10/916,413 filed Aug. 12, 2004, U.S. Pat. No. 7,095,655 which is herein incorporated by reference.

FIELD OF THE INVENTION

The present invention generally relates to AC sensing schemes used for memory systems, such as flash memories, and particularly to a method for dynamic matching of the reference signal path and the sensed cell path without any area penalty, by using a non-accessed path in the array.

BACKGROUND OF THE INVENTION

Reading the contents of memory cells generally involves sensing the current or voltage of the cell. Many kinds of sensing schemes are known in the art for memory cell arrays, such as flash or other non-volatile memories. One type of sensing scheme involves comparing the sensed cell to a reference cell.

Figure 1:
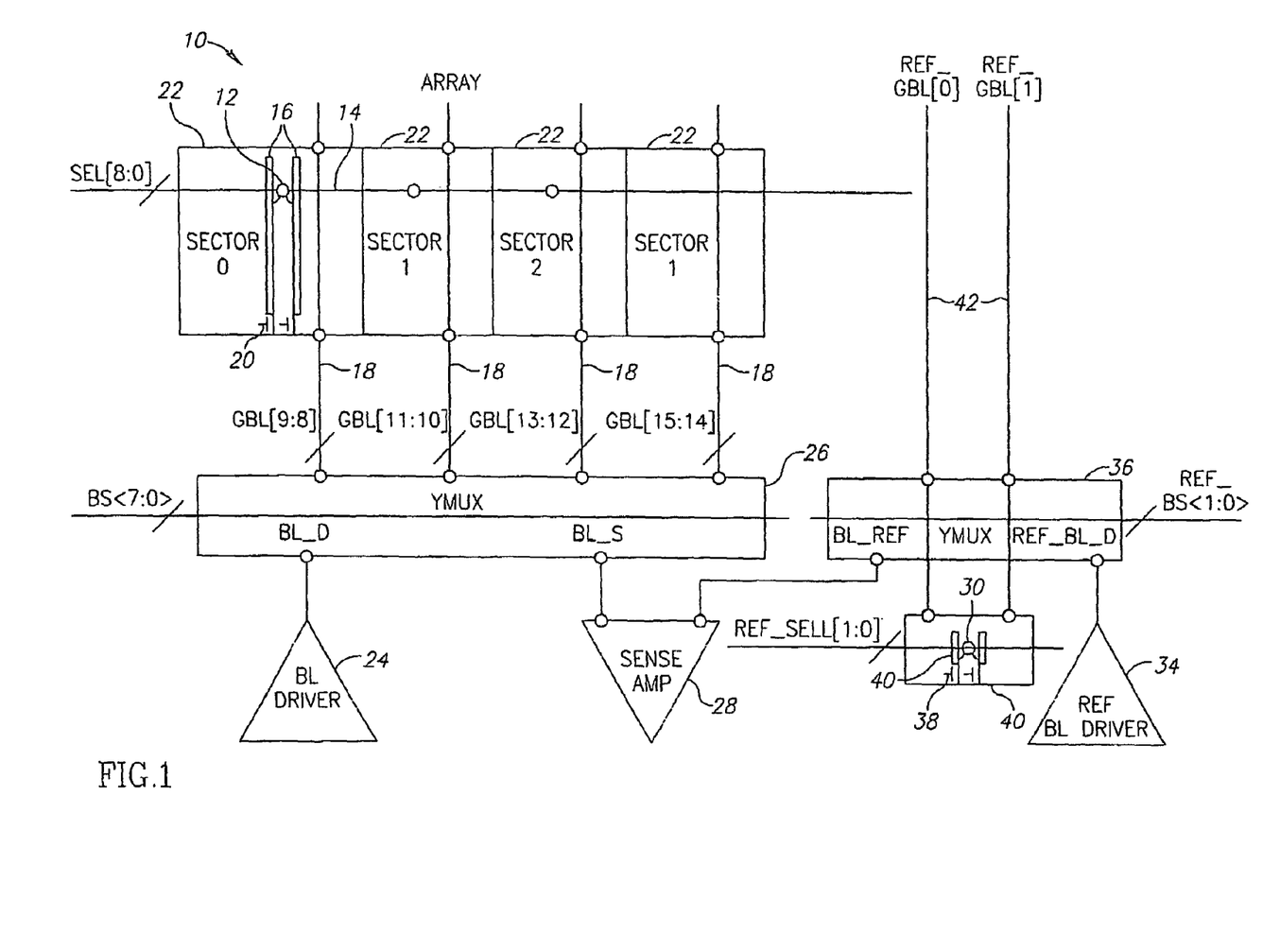
FIG. 1 is a simplified schematic block diagram of a prior-art sensing scheme with designated global bit lines (GBLs) for matching a reference path to an array path associated with a sense amplifier. Array sectors, YMUX and BL-driver are shown for the array and Mini-Array, Ref-YMUX and REF-BL driver are shown for the reference.

Reference is now made to FIG. 1, which illustrates a prior art example of an AC matching scheme between an array sensed cell and a reference cell.

As is well known in the art, a typical memory cell (e.g., virtual ground) array 10, such as non-volatile memory (NVM) cell array, may include a plurality of memory cells 12 connected to word lines and to local bit lines 16. The local bit lines 16 may be connected to global bit lines (GBLs) 18 via select transistors 20. The array 10 may be divided into one or more sectors 22, such as by means of isolation zones. The isolated slices 22 may be segmented in the bit line direction by the select transistors 20, and the select transistors 20 may be arranged in distinct areas in the array 10. This segmentation creates isolated physical sectors. More than one physical sector may share common global bit lines 18. Memory cells 12 in physical sectors that share the same global bit lines 18 may not interact due to the isolating select transistors 20.

A bit line (BL) driver 24 drives the drain side of the sensed cell 12. The BL driver 24 is connected to the sensed cell 12 via a YMUX (Y multiplexer) 26, via a driving path that includes one of the GBLs 18, one of the select transistors 20 and one of the local bit lines 16, which, in this case, serves as a drain diffusion bit-line (DBL). The connecting line to which the select transistor 20 is connected is referred to as select line 14 (designated as select line SEL [8:0] in FIG. 1), and the connecting line in the YMUX 26 is referred to as the BS line.

A sense amplifier 28 senses the source side of the sensed cell 12. The path from the source of the sensed cell 12 to the sense amplifier 28 is through one of the local bit lines 16, which, in this case, serves as a source diffusion bit-line, one of the select transistors 20, one of the GBLs 18 and the YMUx 26.

A reference cell 30 is used for the sense amplifier 28. The reference cell 30 is located in a reference mini-array 32. To match the path of the reference cell 30 to that of the sensed cell 12, a matched reference BL (REF-BL) driver 34 is used in conjunction with a reference YMUX (REF-YMUX) 36, reference select transistors 38 (also referred to as ref-select transistors) and matched reference DBLs (REF-DBL) 40. Since most of the capacitance of the array cell path is the GBL capacitance (due to both to GND and coupling capacitance), reference GBLs (REF-GBLs) 42 are used to load the source side and the drain side of the reference path. The connecting line to which the ref-select transistor 38 is connected is referred to as the REF_SEL line, and the connecting line in the YMUX. 36 is referred to as the REF_BS line.

Such a reference scheme is described in U.S. Pat. No. 6,535,434, to Maayan, Sofer, Eliyahu and Eitan, assigned to the same assignee of the present application, the disclosure of which is incorporated herein by reference. In brief, U.S. Pat. No. 6,535,434 describes an architecture and method for implementing a non-strobed operation on an array cell, in which a reference unit is provided for emulating the response of the array cell during a desired operation (e.g., read, program verify, erase verify or other types of read operations). The architecture and method permit relatively noise-free array cell interrogations at close to ground voltage levels.

The read operation is performed by means of selecting the appropriate BS and SEL lines connecting the drain side of the array cell 12 to the BL driver 24 (at node BL_D) and by means of enabling the appropriate BS and SEL lines connecting the source side of the array cell 12 to the sense amplifier 28 (at node BL_S). In addition the same procedure is applied for the reference cell 30, i.e. enabling the appropriate REF_SEL and REF_BS lines to supply drain voltage from the REF_BL driver 34 (at node REF_BL_D) and connecting the source side of the reference cell 30 to the sense amplifier 28 (at node BL_REF). Once all nodes stabilize, the sensing period starts by floating the sense amplifier (SA) inputs. This leads to charging of the SA inputs by the array cell 12 and the reference cell 30, respectively.

Figure 2:
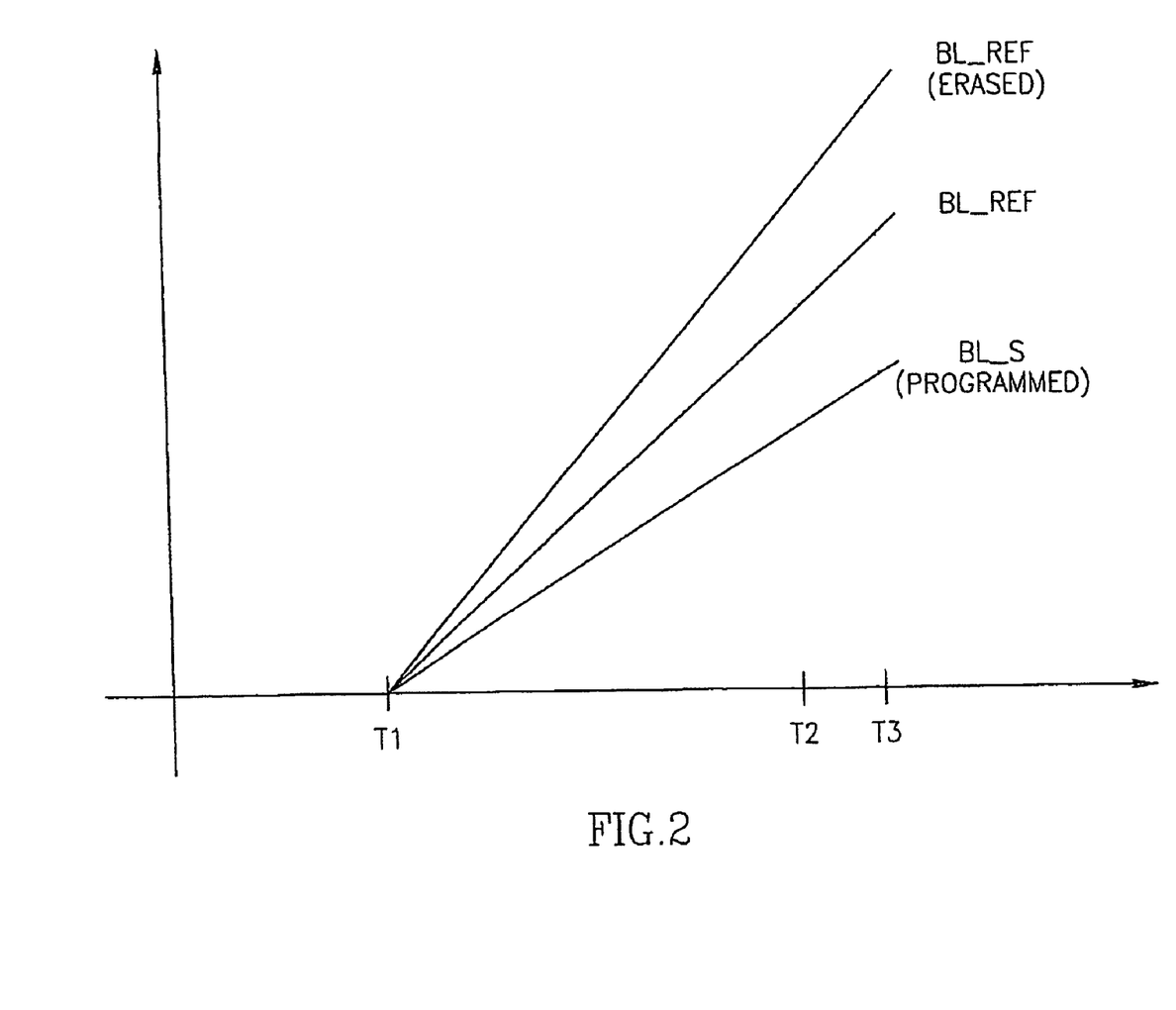
FIG. 2 is a simplified graph of prior-art waveforms of sense amplifier input signals, showing erased and programmed cells as opposed to a reference cell. For 1C:1C matching, the difference in cell current is translated to a difference in voltage level.

Reference is now made to FIG. 2, which illustrates the signals generated at the inputs of the SA 28 with a 1C:1C load capacitance ratio matching scheme. "1C:1C load capacitance ratio matching" means that the capacitance for the sensed cell path and the capacitance for the reference signal path are fully matched. Time T1 represents the time of stabilization of the different nodes. Between the times T1 and T2, the signals BL_S and BL_REF are generated respectively by the array cell 12 and the reference cell 30 charging the total path capacitance. The difference between the signals BL_S and BL_REF depends only on the different programming level of the cells 12 and 30. The reference cell 30 is programmed so that its current level would be between a programmed array cell and an erased array cell. Between times T2 and T3, a decision circuit is used for providing logical output describing the analog output of the SA 28.

In the above-described sensing scheme, the matching between the reference path and the sensed cell path is maintained by copying the sensed cell path to the reference path. This has the disadvantage of multiplying the power dissipation during the sensing period and has a large area penalty. Specifically, in the illustrated example of FIG. 1, the area penalty is two GBLs 18 per sense amplifier 28 and the power penalty is due to the need to drive two drain side GBLs for each read sequence.

SUMMARY OF THE INVENTION

The present invention seeks to provide AC sensing schemes used for memory systems such as but not limited to, flash memories. As described more in detail further below, present invention seeks to provide dynamic matching of the reference signal path and the sensed cell path without any area penalty, by using a non-accessed path in the array. For example, instead of using designated REF_GBLs for the matching, an unused GBL from the array may be used for the source side matching. Furthermore, the drain side GBL already used for the array cell may also be used for the reference cell.

There is thus provided in accordance with an embodiment of the present invention a method for operating a non-volatile memory cell device, the method including providing an array of memory array cells connected to word lines and local bit lines, the local bit lines being connected to global bit lines via select transistors, the array being divided into isolated sectors, providing a sense amplifier operative to sense the memory array cells via a sensing path that includes at least one of the local bit lines, at least one of the select transistors, at least one accessed global bit line, and a YMUX, providing a reference cell located in a reference mini-array, the reference cell being connected to the YMUX and being connected to the sense amplifier via another sensing path, driving both the memory array cells and the reference cells with a common bit line (BL) driver connected to the memory array cells and the reference cells via the YMUX through accessed global bit lines, and matching the sensing path of the memory array cell and the sensing path of the reference cell to the sense amplifier by using a non-accessed global bit line in the sensing path between the reference cell and the sense amplifier. The non-accessed global bit line may be dynamically chosen as the global bit line adjacent to the global bit line used for driving both the drains of the array and the reference cells.

In accordance with an embodiment of the present invention the method further includes matching a coupling signal between the drain and source sides of the memory array cell and the reference cell by using a neighboring, non-accessed global bit line as the reference global bit line. The capacitances of the sensing path of the memory array cell and of the sensing path of the reference cell may be fully matched 1C:1C.

Further in accordance with an embodiment of the present invention the sensing includes source side sensing, wherein the sense amplifier senses the source sides of the memory array cells, the accessed global bit line serving as a global source bit line, and wherein the common bit line (BL) driver drives drain sides of the memory array cells and the reference cells through the accessed global bit lines serving as global drain bit lines.

Still further in accordance with an embodiment of the present invention sensing a bit of one of the memory array cells includes using the local bit line to which a first side of the memory array cell is connected as the local drain bit line, and the local bit line to which a second side of the memory array cell is connected as the local source bit line, connecting the local drain bit line via one of the select transistors to a global bit line, this global bit line becoming the drain global bit line, and connecting the local source bit line via another of the select transistors to another global bit line, this global bit line becoming the source global bit line, connecting the drain global bit line to a reference drain bit line via a ref-select transistor, the drain side of the reference cell of the reference mini-array being connected to the reference drain bit line, connecting another global bit line which is adjacent to the drain global bit line on the opposite side from the source global bit line to a reference source bit line via another ref-select transistor, the source side of the reference cell of the reference mini-array being connected to the reference source bit line, and blocking the global bit line, which is connected to the reference source bit line, from being connected to the array of memory array cells.

BRIEF DESCRIPTION OF THE DRAWINGS

The present invention will be understood and appreciated more fully from the following detailed description taken in conjunction with the drawings in which.

DETAILED DESCRIPTION OF EMBODIMENTS

Figure 3:
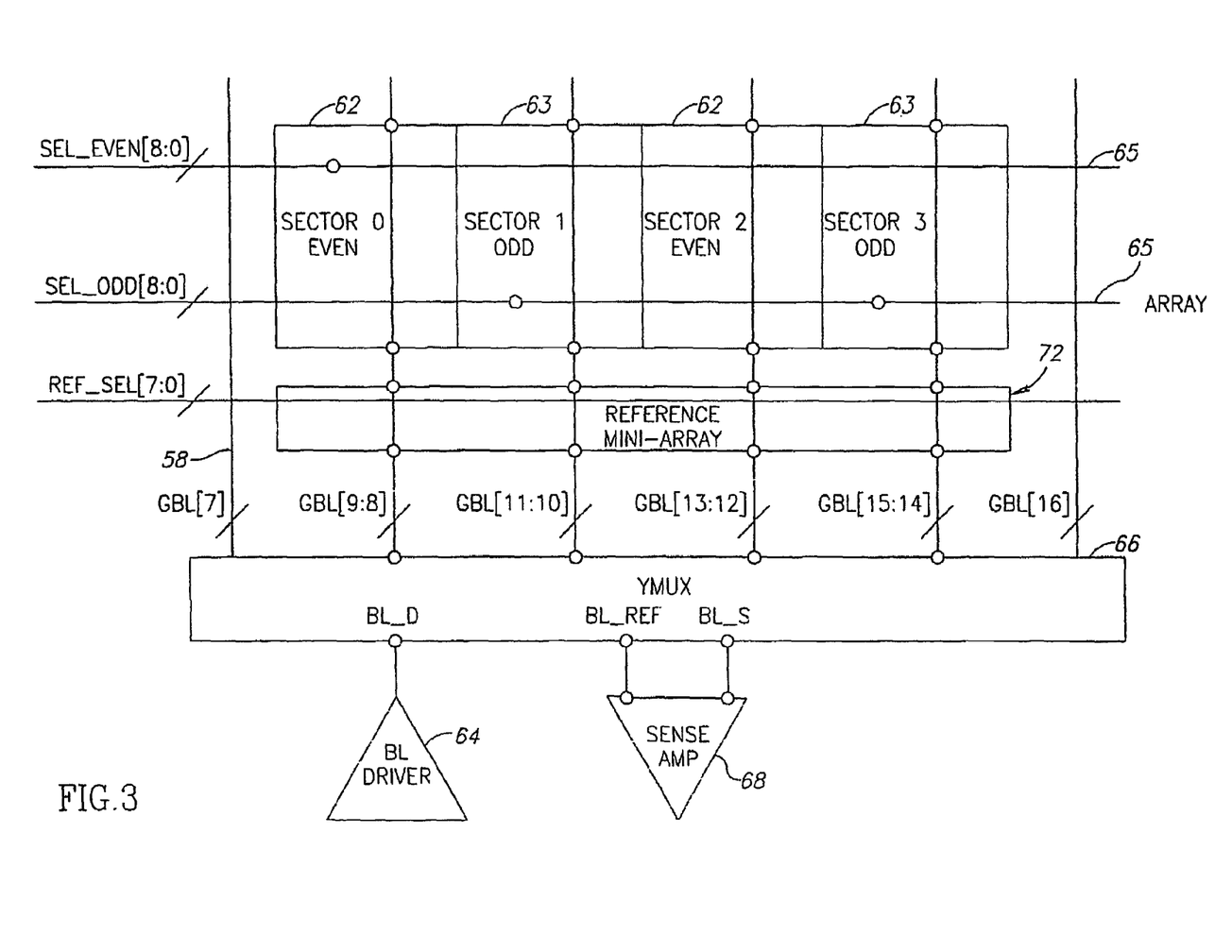
FIG. 3 is a simplified schematic block diagram of a sensing scheme, for matching a reference path to an array path associated with a sense amplifier, in accordance with an embodiment of the present invention.
Figure 4:
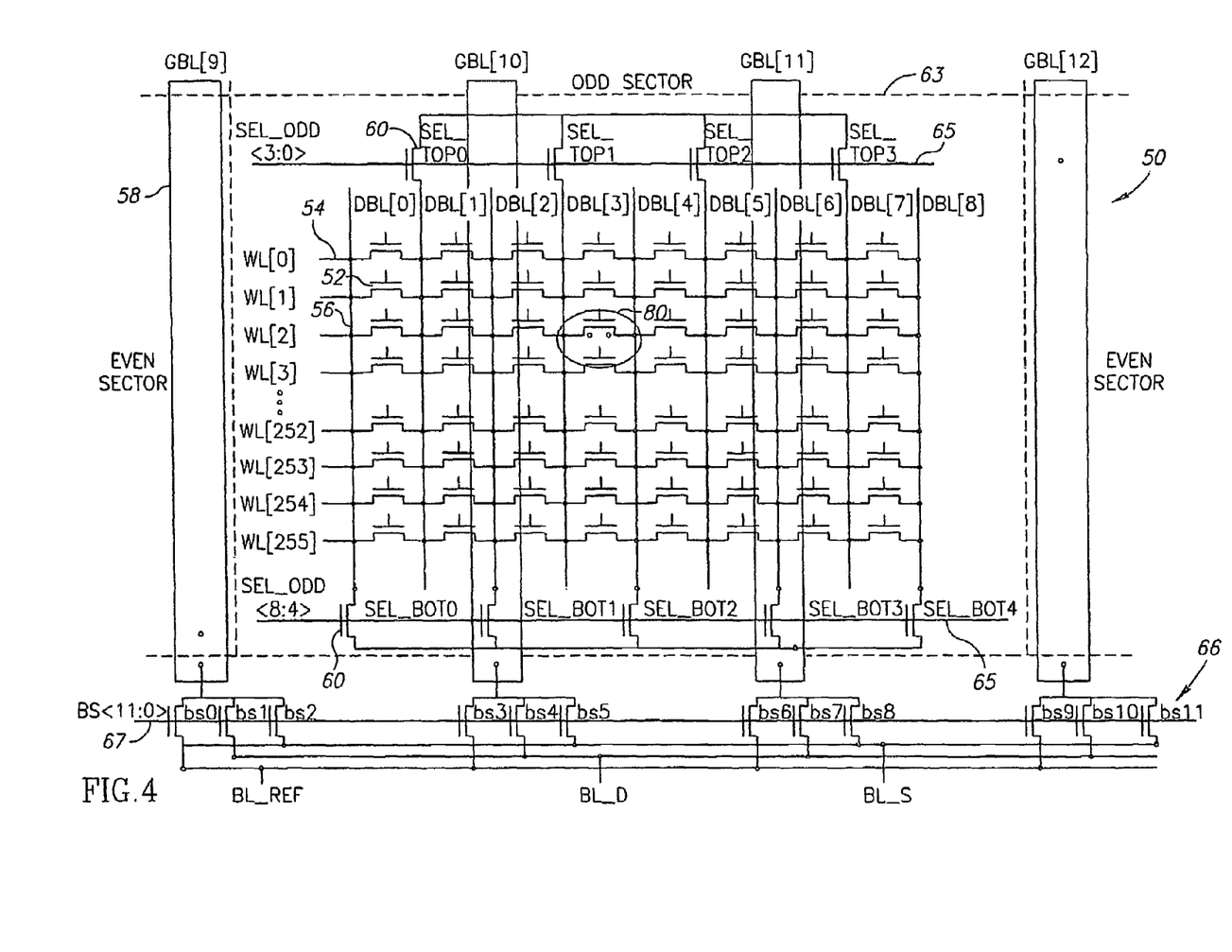
FIG. 4 is a simplified schematic illustration of the array in accordance with an embodiment of the present invention, showing a detailed connection of an odd sector, its global bit lines and two neighboring global bit lines (from even sectors) to the YMUX.
Figure 5:
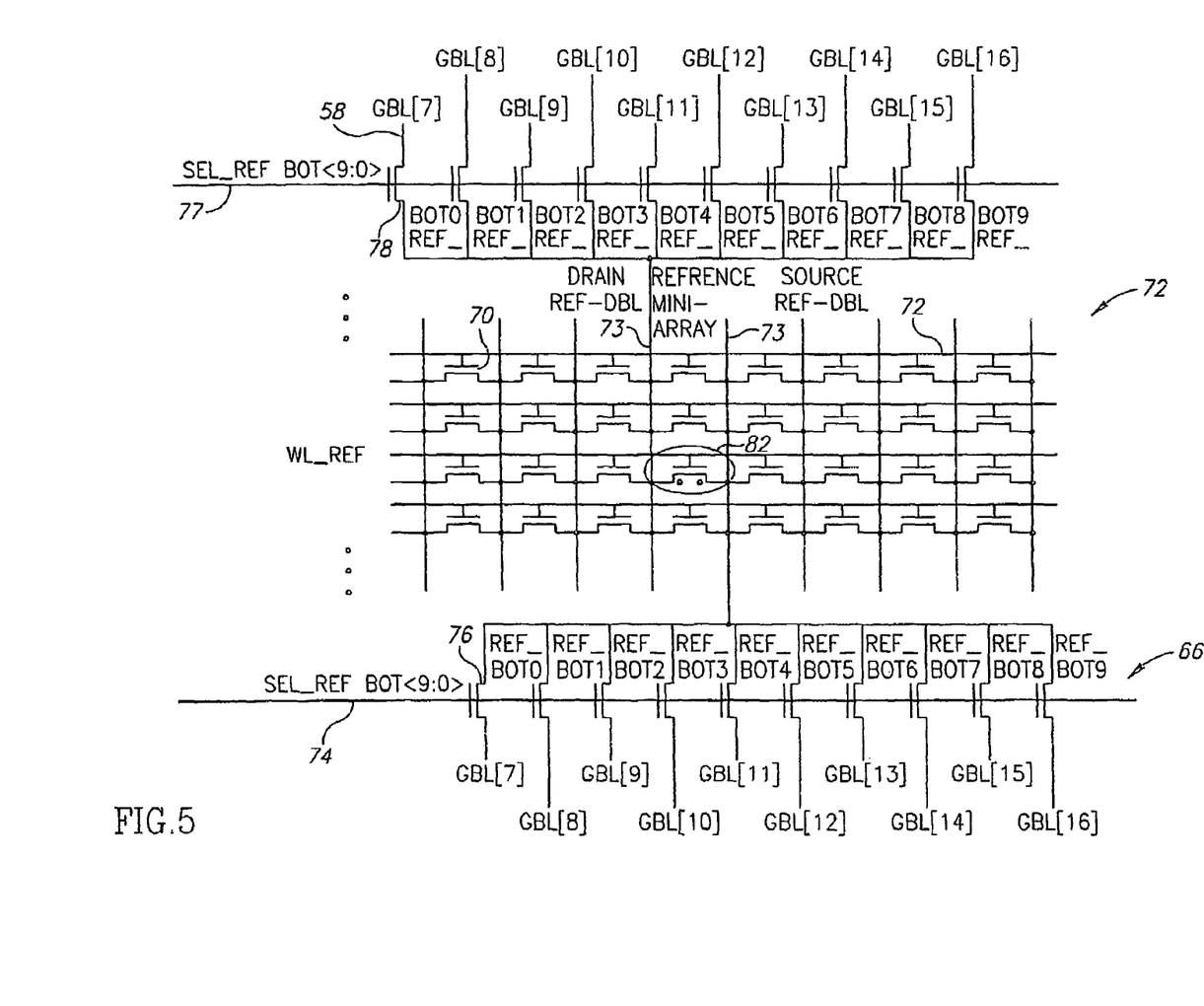
FIG. 5 is a simplified schematic illustration of the reference mini-array in accordance with an embodiment of the present invention, showing a detailed connection of the reference mini-array to the global bit lines.

Reference is now made to FIGS. 3, 4 and 5, which illustrate a sensing scheme for matching a reference path to an array path associated with a sense amplifier, in accordance with an embodiment of the present invention.

A non-volatile memory cell array 50 is shown, which may include a plurality of memory cells 52 connected to word lines 54 and local bit lines 56 (FIG. 4). The local bit lines 56 are designated by the nomenclature DBL in the drawings. The word lines 54 are designated by the nomenclature WL in the drawings. The local bit lines 56 may be connected to GBLs 58 via select transistors 60 (sel_top and sel_bot in FIG. 4). The array 50 may be divided into sectors or slices (discussed further hereinbelow), such as by means of isolation zones.

A BL driver 64 (FIG. 3) may drive the drain side of the sensed memory cell 52. The BL driver 64 may be connected to the sensed cell 52 via a YMUX 66, via a driving path that includes one of the GBLs 58, one of the select transistors 60 and one of the local bit lines 56. The connecting line to which the sensed cell 52 is connected is referred to as the select (SEL) line 65, and the connecting line in the YMUX 66 is referred to as BS line 67 (FIG. 4) to which are connected YMUX transistors 69 (designated as bs0, bs1, etc. in FIG. 4).

A sense amplifier 68 (FIG. 3) may sense the source side of the sensed cell 52. The path from the source of the sensed cell 52 to the sense amplifier 68 may be through one of the local bit lines 56, one of the select transistors 60, one of the GBLs 58 and the YMUX 66.

Reference is now made additionally to FIG. 5. A reference cell 70 may be used for the sense amplifier 68. The reference cell 70 may be located in a reference mini-array 72, which may include word lines 71 and bit lines 73. Unlike the prior art, the present invention obviates the need for a separate reference bit line driver and a separate reference YMUX. Instead, the reference mini-array 72 may be connected to the same YMUX 66 via a connecting line 74, referred to as sel_ref_bot, and reference select transistors 76 (ref_bot) The reference mini-array 72 may be connected to the global bit lines of the array 50 via reference select transistors 76 and 78, which are selected respectively by reference select lines 74 and 77. Reference select line 74 is also referred to as sel_ref_bot, and reference select line 77 is also referred to as sel_ref_top. The same bit line driver 64 may be used to drive the bit lines for both the array cells 52 and the reference cells 70.

For convenience of explanation, the array sectors may be divided into first and second sectors, referred to as even and odd sectors 62 and 63, respectively. In contrast to the prior art, the even and odd sectors 62 and 63 have separate even and odd select lines 65. Thus, the number of select lines 65 is doubled, providing separate access to the even and odd sectors 62 and 63.

As in the prior art, each of the global bit lines 58 can be selected as a drain or source side for the array cell 52 by the YMUX 66. In addition, each of the global bit lines 58 of the sense amplifier 68, plus two neighboring global bit lines from a neighboring sense amplifier, may also be connected to the reference mini-array 72 through the reference select transistors 76 and 78. The YMUX 66 may connect the array cells 52 and the reference cell 70 to the sense amplifier 68 using nodes BL_S and BL_REF, respectively. In addition, the YMUX 66 may connect the bit line driver 64 for both the array cells 52 and the reference cell 70 through node BL_D.

An example of achieving dynamic 1C:1C matching in accordance with an embodiment of the invention is now explained with particular reference to FIG. 4, which shows one of the odd sectors 63. The explanation follows for an exemplary array cell 80, marked by a circle in FIG. 4, which is sensed with respect to an exemplary reference cell 82, marked by a circle in FIG. 5. The array cell 80 and the reference cell 82 are both dual bit cells, each having right and left bits.

Sensing the bit on the right hand side means using the bit line DBL[3] as the drain bit line, and the bit line DBL[4] as the source bit line. Accordingly, this involves connecting the bit line DBL[3] to the BL driver 64 via node BL_D, and connecting the bit line DBL[4] to the sense amplifier 68 via node BL_S. This is achieved by activating the select transistors 60, sel_top1 and sel_bot2, using the appropriate sel_odd lines 65. The global bit line GBL[10] is used as the drain GBL, while the global bit line GBL[11] is used as the source GBL, this being implemented by activating the YMUX transistors bs4 and bs8, which respectively connect global bit line GBL[10] to node BL_D and global bit line GBL[11] to node BL_S. The global bit line GBL[10] drives the drain side of both the array cell 80 and the reference cell 82.

Referring now to FIG. 5, which shows the connection of the GBLs 58 to the reference mini-array 72, global bit line GBL[10] is connected to the drain bit line 73 designated Drain REF_DBL, implemented by activating the ref_top3 select transistor 78. To maintain a complete matching, the global bit line GBL[9] is selected to be the global bit line that loads the source side of the reference cell 82 (i.e. connecting to the source bit line 73 designated source REF-DBL). The global bit line GBL[9] is selected because both global bit lines GBL[9] and GBL[11] are neighbors of the global bit line GBL[10]. This not only provides matching of the capacitance to ground, but also provides a full match of the coupling between drain and source of the array cell 80 and the reference cell 82.

The global bit line GBL[9] may be selected and connected to the Ref-Source DBL by activating ref-select transistor 76 ref_bot2. The connection of GBL[9] to the array 50 must be blocked and this may be achieved simply by the aforementioned partition of even and odd sectors. Thus, the connection of GBL[9] to the array 50 may be blocked by de-activating the sel_even lines. Finally, the global bit line GBL[9] may be connected to the sense amplifier 68 via node BL-REF by activating transistor 69 bs0 in the YMUX 66.

Sensing the left side bit of array cell 80 means using the bit line DBL[4] as the drain bit line, and the bit line DBL[3] as the source bit line. Accordingly, this involves connecting the bit line DBL[3] to the sense amplifier 68 via node BL_S, and connecting the bit line DBL[4] to the BL driver 64 via node BL_D. This is achieved by activating the select transistors 60, sel_top1 and sel_bot2, using the appropriate sel_odd lines 65. The global bit line GBL[10] is used as the source GBL, while the global bit line GBL[11] is used as the drain GBL, this being implemented by activating the YMUX transistors bs7 and bs5, which respectively connect global bit line GBL[11] to node BL_D and global bit line GBL[10] to node BL_S. The global bit line GBL[11] drives the drain side of both the array cell 80 and the reference cell 82.

The global bit line GBL[11] is connected to the drain bit line 73 designated Drain REF_DBL, implemented by activating the ref_top4 select transistor 78. To maintain a complete matching, the global bit line GBL[12] is selected to be the global bit line that loads the source side of the reference cell 82 (i.e. connecting to the source bit line 73 designated source REF-DBL). The global bit line GBL[12] is selected because both global bit lines GBL[10] and GBL[12] are neighbors of the global bit line GBL[11].

The global bit line GBL[12] may be selected and connected to the Ref-Source DBL by activating ref-select transistor 76 ref_bot5. The connection of GBL[12] to the array 50 may be blocked by de-activating the sel_even lines. Finally, the global bit line GBL[12] may be connected to the sense amplifier 68 via node BL-REF by activating transistor 69 bs9 in the YMUX 66.

The resulting signals generated at the sense amplifier inputs would be the same as the ones shown for the prior art in FIG. 2. No timing penalty or difference is expected.

Some of the advantages of the present invention over the prior art include, without limitation, full capacitance matching, area reduction and power reduction. As described above, the matching may be achieved by using a common drain drive for the array cell and the reference cell, matching the capacitance to ground by using a non-accessed global bit line as a load to the source side of the reference cell, and/or matching the coupling signal between the drain and source by using the neighboring, non-accessed global bit line as the reference global bit line. Using a non-accessed global bit line from the array as the reference global bit line may reduce "real estate" in the chip by eliminating the need for additional reference global bit lines. The power consumption may be reduced by driving only one drain global bit line for both the array cell and the reference cell as opposed to the prior art which drives two separate global bit lines, one for the array cell and another for the reference cell.

The present invention may require additional select transistors for the reference mini-array 72, as well as additional decoding for the separate even and odd select lines 65, which is a small penalty compared to the total outcome.

It will be appreciated by persons skilled in the art that the present invention is not limited by what has been particularly shown and described hereinabove. Rather the scope of the present invention includes both combinations and subcombinations of the features described hereinabove as well as modifications and variations thereof which would occur to a person of skill in the art upon reading the foregoing description and which are not in the prior art.

What is claimed is:

1. A method for operating a non-volatile memory cell device including a memory cell array with memory cells and reference cells, said method comprising:

driving a memory cell and a reference cell with a common bit line (BL) driver connected to the memory cell and the reference cell via a multiplexer through accessed global bit lines; and matching a sensing path of the memory cell and the reference cell sensing path to a sense amplifier by using a non-accessed global bit line in the sensing path between the reference cell and the sense amplifier.

2. The method according to claim 1, wherein the non-accessed global bit line is dynamically chosen as the global bit line adjacent to the global bit line used for driving both the drains of the array and the reference cells.

3. The method according to claim 1, further comprising matching a coupling signal between the drain and source sides of the memory array cell and the reference cell by using a neighboring, non-accessed global bit line as the reference global bit line.

4. The method according to claim 3, wherein capacitances of the sensing path of the memory array cell and of the sensing path of the reference cell are fully matched.

5. The method according to claim 1, wherein the sensing comprises source side sensing, wherein said sense amplifier senses the source sides of the memory array cells, the accessed global bit line serving as a global source bit line, and wherein said common bit line (BL) driver drives drain sides of the memory array cells and the reference cells through the accessed global bit lines serving as global drain bit lines.

6. The method according to claim 1, wherein the memory array cells and the reference cell comprise dual bit cells, each having a right side bit and a left side bit.

7. A non-volatile memory cell device comprising: a memory cell array with memory cells and reference cells, and control logic adapted to drive a memory cell and a reference cell with a common bit line (BL) driver connected to the memory cell and the reference cell via a multiplexer through accessed global bit lines; and matching a sensing path of the memory cell and the reference cell sensing path to a sense amplifier by using a non-accessed global bit line in the sensing path between the reference cell and the sense amplifier.

8. The device according to claim 7, wherein the non-accessed global bit line is dynamically chosen as the global bit line adjacent to the global bit line used for driving both the drains of the array and the reference cells.

9. The device according to claim 7, further comprising matching a coupling signal between a drain and source of the memory array cell and the reference cell by using a neighboring, non-accessed global bit line as a reference global bit line.

10. The device according to claim 9, wherein capacitances of the sensing path of the memory array cell and of the sensing path of the reference cell are fully matched.

11. The device according to claim 7, wherein the sensing comprises source side sensing, wherein said sense amplifier senses the source sides of the memory array cells, the accessed global bit line serving as a global source bit line, and wherein said common bit line (BL) driver drives drain sides of the memory array cells and the reference cells through the accessed global bit lines serving as global drain bit lines.

12. The device according to claim 7, wherein the memory array cells and the reference cell comprise dual bit cells, each having a right side bit and a left side bit.

* * * * *